(12) United States Patent
Sugie et al.

(10) Patent No.: US 12,354,829 B2
(45) Date of Patent: Jul. 8, 2025

(54) OVERLAY MEASUREMENT SYSTEM AND OVERLAY MEASUREMENT DEVICE FOR OVERLAY ERROR MEASUREMENT USING ELECTRON MICROSCOPY

(71) Applicant: Hitachi High-Tech Corporation, Tokyo (JP)

(72) Inventors: Masaki Sugie, Tokyo (JP); Kei Sakai, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 490 days.

(21) Appl. No.: 17/597,266

(22) PCT Filed: Aug. 23, 2019

(86) PCT No.: PCT/JP2019/033143
§ 371 (c)(1),
(2) Date: Dec. 30, 2021

(87) PCT Pub. No.: WO2021/038649
PCT Pub. Date: Mar. 4, 2021

(65) Prior Publication Data
US 2022/0319804 A1 Oct. 6, 2022

(51) Int. Cl.
*H01J 37/22* (2006.01)
*H01J 37/244* (2006.01)
*H01J 37/28* (2006.01)

(52) U.S. Cl.
CPC .......... *H01J 37/222* (2013.01); *H01J 37/244* (2013.01); *H01J 37/28* (2013.01);
(Continued)

(58) Field of Classification Search
None
See application file for complete search history.

(56) References Cited

U.S. PATENT DOCUMENTS

| 7,080,330 B1 | 7/2006 | Choo et al. |
| 2015/0002652 A1* | 1/2015 | Takasugi ............... G01B 15/00 348/80 |

(Continued)

FOREIGN PATENT DOCUMENTS

| JP | 2014-86393 A | 5/2014 |
| JP | 2015-210140 A | 11/2015 |

(Continued)

OTHER PUBLICATIONS

International Search Report (PCT/ISA/210) issued in PCT Application No. PCT/JP2019/033143 dated Nov. 12, 2019 with English translation (five (5) pages).

(Continued)

*Primary Examiner* — Andrew Smyth
(74) *Attorney, Agent, or Firm* — Crowell & Moring LLP

(57) ABSTRACT

The present invention enables an overlay error between processors to be measured from a pattern image, the SN ratio of which is low. To this end, the present invention forms a secondary electron image 200 from a detection signal of a secondary electron detector 107, forms a reflected electron image 210 from a detection signal of a reflected electron detector 109, creates a SUMLINE profile 701 that is obtained by adding luminance information in the reflected electron image along the longitudinal direction of a line pattern, and calculates an overlay error of a sample by using position information about an upper layer pattern detected from the secondary electron image and position information about a lower layer pattern that is detected by using an estimation line pattern 801 estimated on the basis of the SUMLINE profile from the reflected electron image.

34 Claims, 12 Drawing Sheets

(52) U.S. Cl.
CPC ............... *H01J 2237/226* (2013.01); *H01J 2237/24475* (2013.01); *H01J 2237/2448* (2013.01); *H01J 2237/24578* (2013.01); *H01J 2237/2809* (2013.01); *H01J 2237/2817* (2013.01)

(56) References Cited

U.S. PATENT DOCUMENTS

| | | | |
|---|---|---|---|
| 2015/0287569 | A1 | 10/2015 | Yamamoto et al. |
| 2016/0056014 | A1* | 2/2016 | Yamamoto ............ H01J 37/222 250/307 |
| 2017/0047197 | A1 | 2/2017 | Hotta et al. |
| 2019/0017817 | A1 | 1/2019 | Fukunaga |
| 2020/0201019 | A1 | 6/2020 | Takasugi et al. |

FOREIGN PATENT DOCUMENTS

| | | |
|---|---|---|
| KR | 10-2014-0119097 A | 10/2014 |
| KR | 10-2015-0140331 A | 12/2015 |
| WO | WO 2014/181577 A1 | 11/2014 |
| WO | WO-2016132248 A1 * | 8/2016 ............ B05D 1/185 |
| WO | WO 2017/130365 A1 | 8/2017 |

OTHER PUBLICATIONS

Japanese-language Written Opinion (PCT/ISA/237) issued in PCT Application No. PCT/JP2019/033143 dated Nov. 12, 2019 (three (3) pages).

Korean-language Office Action issued in Korean Application No. 10-2021-7042382 dated Jan. 31, 2023 with English translation (eight (8) pages).

Chinese-language Office Action issued in Chinese Application No. 201980099625.9 dated May 31, 2023 with English translation (18 pages).

* cited by examiner

FIG. 10

| | OVERLAY ERROR MEASUREMENT CONDITION SETTING | | | 1000 |
|---|---|---|---|---|
| | SEM CONDITION | | | |
| 1001 | PIXEL X, Y | X: 512 | Y: 512 | |
| 1002 | Vac [V] | 800 | | |
| 1003 | I PROBE [pA] | 8 | | |
| 1004 | NUM OF FRAMES | 2 | | |
| | SE DETECTOR | | | |
| 1005 | TARGET | HOLE | v | |
| 1006 | ALGORITHM | DETECTION OF PATTERN CENTER | v | |
| 1007 | MEASUREMENT OPTION | - | v | |
| | BSE DETECTOR | | | |
| 1008 | TARGET | LINE & SPACE | v | |
| 1009 | ALGORITHM | SUM LINE | v | |
| 1010 | MEASUREMENT OPTION | DEVIATION OF X DIRECTION | v | |
| | APPLY | | | |

OVERLAY MEASUREMENT SYSTEM AND OVERLAY MEASUREMENT DEVICE FOR OVERLAY ERROR MEASUREMENT USING ELECTRON MICROSCOPY

TECHNICAL FIELD

The present invention relates to a measurement technique in a manufacturing process of a semiconductor device. Specifically, the invention relates to an overlay measurement system and an overlay measurement device, each performing overlay measurement to measure amount of pattern shift between steps.

BACKGROUND ART

With miniaturization of a semiconductor device, an exposure apparatus is required to be improved in pattern overlay accuracy between a plurality of layers. It will be probably more important to accurately measure such overlay and give feedback on the overlay to the exposure apparatus.

The semiconductor device is manufactured by repeating a step of transferring a pattern formed on a photomask on a semiconductor wafer by lithography processing and etching processing. Quality of the lithography processing, the etching processing, or other processing, production of foreign matter, and the like greatly affect yield in a manufacturing process of the semiconductor device. The pattern on the semiconductor wafer is therefore measured or examined in the manufacturing process in order to detect such abnormality or failure occurrence early or beforehand in the manufacturing process.

In particular, importance of pattern overlay accuracy between different steps is increased due to recent progress of miniaturization and a three-dimensional structure of the semiconductor device. Although optical measurement techniques have been widely used in overlay measurement, it is now difficult to achieve required measurement accuracy in a highly miniaturized semiconductor device.

Hence, an overlay measurement has been developed using a charged particle radiation apparatus (scanning electron microscope). In Patent Literature 1, an electron beam is applied to a substrate at higher acceleration and larger current than in normal length measurement to charge the substrate, so that potential contrast due to a difference in lower-layer structure is detected and a lower-layer pattern position is thus detected to perform overlay measurement. In such a case, since overlay deviation measurement offset occurs depending on an electron beam scan direction or operation order, the scan direction or the scan order is made to have symmetry to cancel the measurement offset, thereby overlay deviation measurement accuracy is improved.

In Patent Literature 2, a highly accelerated electron beam is applied to obtain a transmission image of a pattern unexposed on a sample surface for overlay measurement. In such a case, even for only one pattern, the pattern appears with a plurality of image depths due to influence of a layer formed over the pattern unexposed on the sample surface, and thus a pattern boundary is defined using a template.

CITATION LIST

Patent Literature

[Patent Literature 1] Japanese Unexamined Patent Application Publication No. 2015-210140.

[Patent Literature 2] International Publication WO 2017/130365.

SUMMARY OF INVENTION

Technical Problem

The pattern unexposed on a sample surface is thus necessary to be detected in overlay measurement using the charged particle radiation apparatus (scanning electron microscope), and thus larger energy needs to be applied to the sample than in length measurement of a pattern on a sample surface. Further, a clear image is desirably obtained to improve measurement accuracy. To achieve these, a cumulative frame number for forming an electron microscopic image is typically increased.

However, when overlay measurement is performed on a semiconductor wafer in a manufacturing process of a semiconductor device, overlay between a resist pattern formed on a sample surface and an electrode or an interconnection pattern formed on a layer under the resist pattern may be desirably verified. In such a case, since a resist being an organic matter tends to shrink under the influence of the electron beam, an image is desirably acquired while the irradiation amount of the electron beam on a sample is reduced as much as possible to perform overlay measurement. In addition, an increase in cumulative frame number naturally reduces throughput of overlay measurement.

It is therefore desirable to perform overlay measurement with an image while energy of a primary electron beam to be applied to a sample is reduced as much as possible, and the cumulative frame number is also decreased as much as possible. An electron microscopic image formed under such a condition must have a low signal to noise ratio (SN). In other words, overlay measurement needs to be performable with an electron microscopic image having low SN.

Solution to Problem

An overlay measurement system of one embodiment of the invention is characterized by including a scanning electron microscope and a computer subsystem, and measuring overlay error of a sample having an upper-layer pattern and a lower-layer pattern including a line pattern, where the scanning electron microscope includes an electron optical system that applies a primary electron beam to the sample, a secondary electron detector that detects secondary electrons among signal electrons emitted by scanning a surface of the sample with the primary electron beam, and a backscattered electron detector that detects backscattered electrons among the signal electrons, and the computer subsystem is configured to form a secondary electron image from a detection signal of the secondary electron detector and form a backscattered electron image from a detection signal of the backscattered electron detector, create a SUMLINE profile by summing luminance information of the backscattered electron image along a longitudinal direction of the line pattern, and calculate overlay error of the sample using positional information of the upper-layer pattern detected from the secondary electron image and positional information of the lower-layer pattern detected using an estimated line pattern estimated based on the SUMLINE profile from the backscattered electron image.

An overlay measurement device of one embodiment of the invention, which measures overlay error of a sample having an upper-layer pattern and a lower-layer pattern including a line pattern from a secondary electron image and a backscattered electron image, which are each acquired by a scanning electron microscope, of the sample, includes a profile creation section that creates a SUMLINE profile by summing luminance information of the backscattered electron image along a longitudinal direction of the line pattern, and an overlay calculation section that calculates overlay error of the sample using positional information of the upper-layer pattern detected from the secondary electron image and positional information of the lower-layer pattern detected using an estimated line pattern estimated based on the SUMLINE profile from the backscattered electron image, where the secondary electron image is an electron microscopic image formed based on secondary electrons contained in signal electrons emitted by scanning a surface of the sample with a primary electron beam, and the backscattered electron image is an electron microscopic image formed based on backscattered electrons contained in the signal electrons.

Advantageous Effects of Invention

An overlay error between processes can be measured from a pattern image having low SN.

Other problems and novel features will be clarified from the content of this description and the accompanied drawings.

BRIEF DESCRIPTION OF DRAWINGS

FIG. 10 illustrates an example of a graphical user interface (GUI) screen to set a measurement condition.

DESCRIPTION OF EMBODIMENTS

Hereinafter, some embodiments of the invention are described in detail with reference to drawings.

First Embodiment

Figure 1:
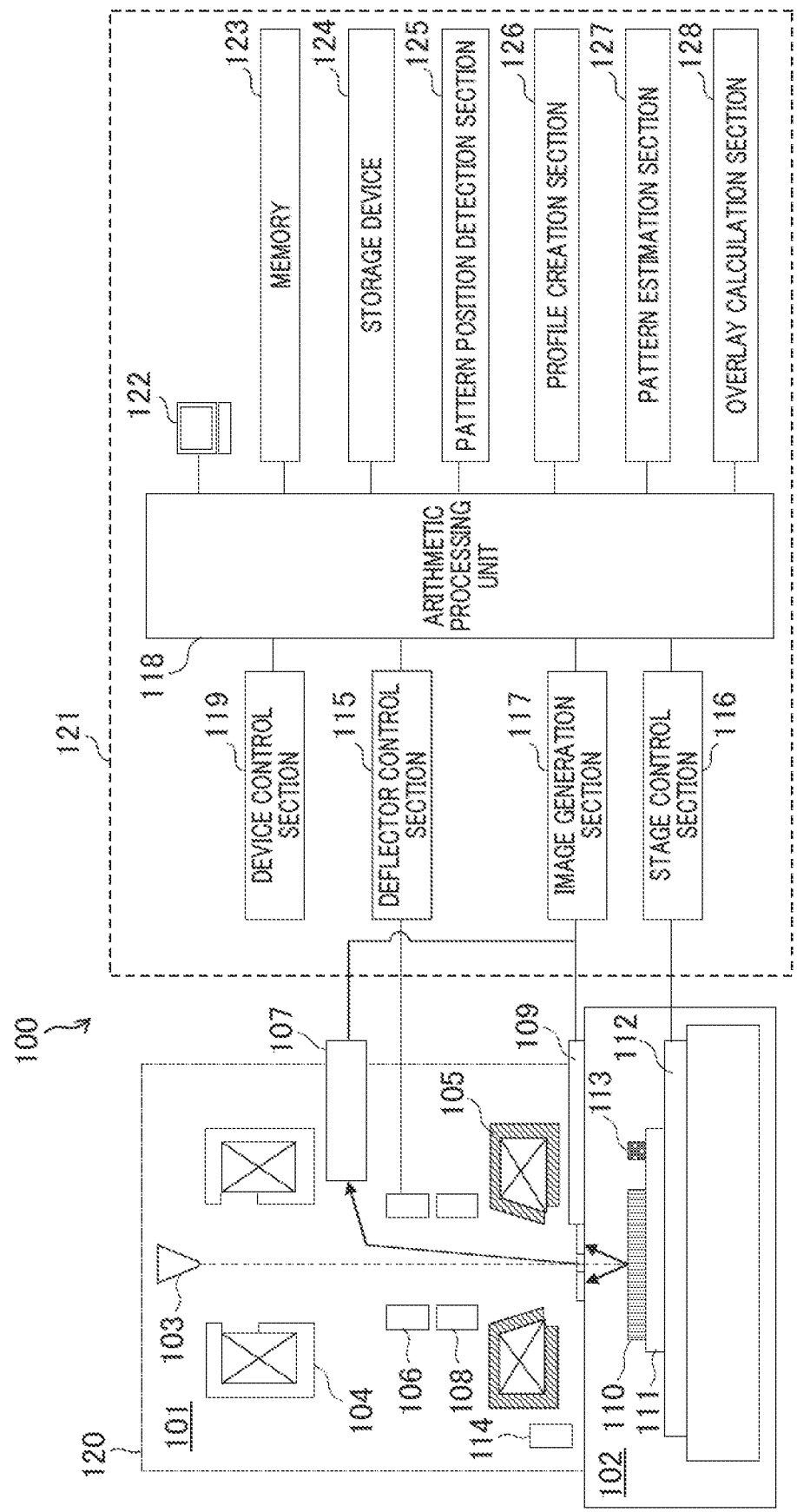
FIG. 1 illustrates a schematic configuration example of an overlay measurement system of a first embodiment.

FIG. 1 illustrates a schematic configuration example of an overlay measurement system of a first embodiment. The overlay measurement system 100 includes an imaging tool 120 and a computer subsystem (overlay measurement device) 121. In the first embodiment, a scanning electron microscope is used as the imaging tool 120. The imaging tool 120 is configured of a column 101 incorporating an electron optical system that applies a primary electron beam to a sample, and a sample chamber 102 for placing a sample to be measured therein. The column 101 internally includes an electron gun 103, a condenser lens 104, an object lens 105, a deflector 106, a secondary electron detector (SE Detector) 107, an E×B filter 108, and a backscattered electron detector (BSE Detector) 109. A primary electron beam (also referred to as irradiation electron beam or charged particle beam) generated from the electron gun 103 is converged by the condenser lens 104 and the object lens 105, and applied to a wafer (sample) 110 placed on an electrostatic chuck 111, and signal electrons are emitted due to an interaction of the primary electron beam with the sample. The primary electron beam is deflected by the deflector 106 and scanned along a surface of the wafer 110. Deflection of the primary electron beam by the deflector 106 is controlled according to a signal provided from a deflector control section 115.

Secondary electrons (referring to low-energy electrons in the signal electrons) generated from the wafer 110 due to irradiation of the primary electron beam are directed toward the secondary electron detector 107 by the E×B filter 108 and detected by the secondary electron detector 107. Backscattered electrons (referring to high-energy electrons in the signal electrons) from the wafer 110 is detected by the backscattered electron detector 109. The configuration of the optical system is not limited to the configuration of FIG. 1, and may include, for example, another lens, another electrode, or another detector, or may be partially different from the configuration of FIG. 1.

A movable stage 112 provided in the sample chamber 102 moves a position of the wafer 110 in an XY plane (in a horizontal plane) with respect to the column 101 according to a control signal provided from a stage control section 116. A standard sample 113 for beam correction is attached on the movable stage 112. The imaging tool 120 includes an optical microscope 114 for wafer alignment. Detection signals output from the secondary electron detector 107 and the backscattered electron detector 109 are sent to an image generation section 117 and imaged therein.

Control of the imaging tool 120 is performed via a device control section 119 and control sections (the deflector control section 115 and the stage control section 116 are exemplified in FIG. 1) of the computer subsystem 121, the control sections controlling respective components of the imaging tool 120. Specifically, the device control section 119 gives a predetermined instruction to each control section, and the control section controls the relevant component of the imaging tool 120 in response to the instruction.

The computer subsystem 121 includes an arithmetic processing unit 118, an input/output unit 122, a memory 123, and a storage device 124. The computer subsystem 121 can be implemented using a general-purpose computer. The arithmetic processing unit 118 includes a processor performing arithmetic processing, such as a central processing unit (CPU). The input/output unit 122 includes an input section, such as a mouse or a keyboard, to allow an operator to input an instruction, and a display section such as a monitor to display a screen. The memory 123 is configured of a random-access memory (RAM), and temporarily stores a program and data necessary for executing the program according to a command from the processor. The storage device 124 is typically configured of a hard disc drive (HDD), a solid-state drive (SSD), a read-only memory (ROM), or a nonvolatile memory such as a flash memory, and stores a program executed by the arithmetic processing unit 118 and data as a processing object of the program.

The detection signals from the secondary electron detector 107 and the backscattered electron detector 109 are sent to the image generation section 117. The image generation section 117 two-dimensionally maps intensity of a detection signal, which is obtained by two-dimensional scanning a surface of the wafer 110 with the primary electron beam by the deflector 106, to generate an image. The image generated by the image generation section 117 is stored in the storage device 124.

The computer subsystem 121 further includes a pattern position detection section 125, a profile creation section 126, a pattern estimation section 127, and an overlay calculation section 128 to perform overlay measurement using the image imaged by the imaging tool 120 and stored in the storage device 124. Functions performed by such modules 125 to 128 are described in detail later.

The control sections and the modules 117, 119, and 125 to 128 may each be implemented in any form without limitation. For example, each control section or module may be implemented in a form of software executed by the processor included in the arithmetic processing unit 118. In such a case, the storage device 124 beforehand stores a program for executing the control section or the module. When the control section or the module is implemented by software, the program is easily upgraded by updating a recording medium in which the program is recorded. The computer subsystem may be configured of a multiprocessor system in place of the high-speed general-purpose CPU, in which the arithmetic processing unit 118 may be configured of a main processor, and the control sections and the modules may each be configured of a sub-processor. Alternatively, the control sections and the modules may each be configured of hardware having a dedicated circuit board. A plurality of arithmetic units performing the respective pieces of processing are integrated on a wiring substrate or in a semiconductor chip or in a package.

A structure of a sample to be subjected to overlay measurement is now described. Here, description is given with an exemplary formation step of vias connecting respective electrodes or interconnections, which are formed in a form of a line pattern, of a semiconductor element such as a transistor or a capacitor to interconnections in an interconnection layer formed as an upper layer of the semiconductor element. If a hole pattern for forming the vias and the line pattern for forming the electrodes or the interconnections are not formed in a positional relationship as designed, bad via connection may occur. If performance of the semiconductor element is degraded thereby and in turn electrical contact is lost, the semiconductor device may finally not operate normally. An overlay measurement system is thus used for a wafer in a via formation step to verify whether a positional relationship between the overlapped hole pattern and line pattern is appropriate.

In this exemplary case, the upper-layer pattern observed by the overlay measurement system is a hole pattern formed in the resist layer, and the lower-layer pattern is a line pattern formed on the wafer. The lower-layer pattern is a line pattern formed under a film to be etched (such as an organic film or an insulating film) directly under the upper-layer pattern. The line pattern includes a metal layer or a semiconductor layer.

The upper-layer pattern including an organic matter (resist) is desirably observed using a secondary electron image formed from a detection signal of the secondary electron detector 107 sensitive to a surface shape of a sample surface. For obtaining an electron microscopic image, an observation visual field is typically scanned plural times with primary electrons, and a frame image (image obtained by one scan) is cumulated to make the image clear. Although a high-frame image (image formed by integrating many frame images) is desirable from the viewpoint of making the image clear, it is desirable here to use a low-frame image with the number of times of scan being decreased as much as possible as long as the hole pattern can be confirmed.

The high-frame image inevitably increases the number of times of scan, leading to a reduction in throughput of the overlay measurement system. Further, since the resist, in which the upper-layer pattern is to be formed, includes an organic matter, the resist tends to shrink when being irradiated with a large number of primary electrons. Hence, the number of times of scan is desirably decreased as much as possible. In particular, since the overlay measurement system further requires observation of the lower-layer pattern, when accelerating voltage of the irradiating primary electron beam is increased, the resist is more greatly affected by the primary electrons.

On the other hand, a backscattered electron image formed from a detection signal of the backscattered electron detector 109 is used for observation of the lower-layer pattern. This is because the high-energy backscattered electron can be detected by the backscattered electron detector 109 while being less affected by the layer formed on the lower-layer pattern than the low-energy secondary electron. In addition, the generation amount of backscattered electron is affected by an element constituting a sample, and increases with an increase in average atomic number, and thus when the line pattern contains metal, a larger contrast is expected to be obtained. However, in the overlay measurement system of the first embodiment, since overlay measurement is performed using a secondary electron image and a backscattered electron image obtained in the same scan, the backscattered electron image of the lower-layer pattern is also a low-frame image and inevitably has low contrast.

Figure 2A:
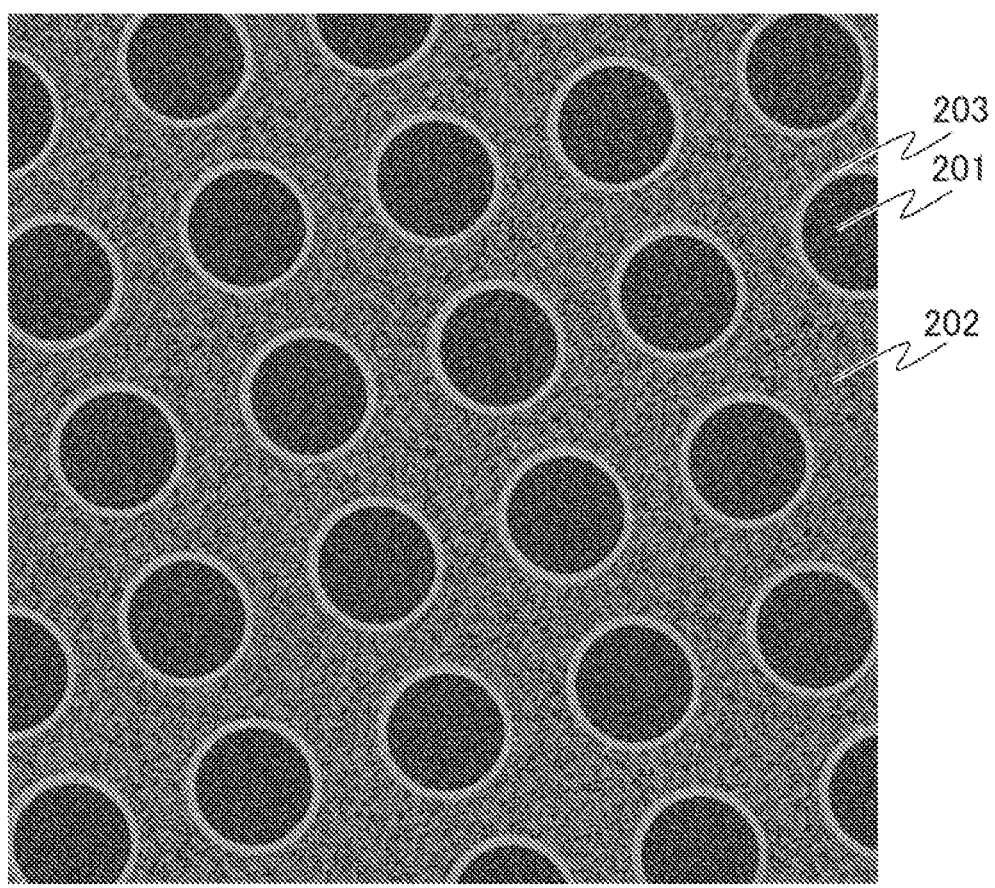
FIG. 2A is a schematic view of an upper-layer pattern image (secondary electron image).
Figure 2B:
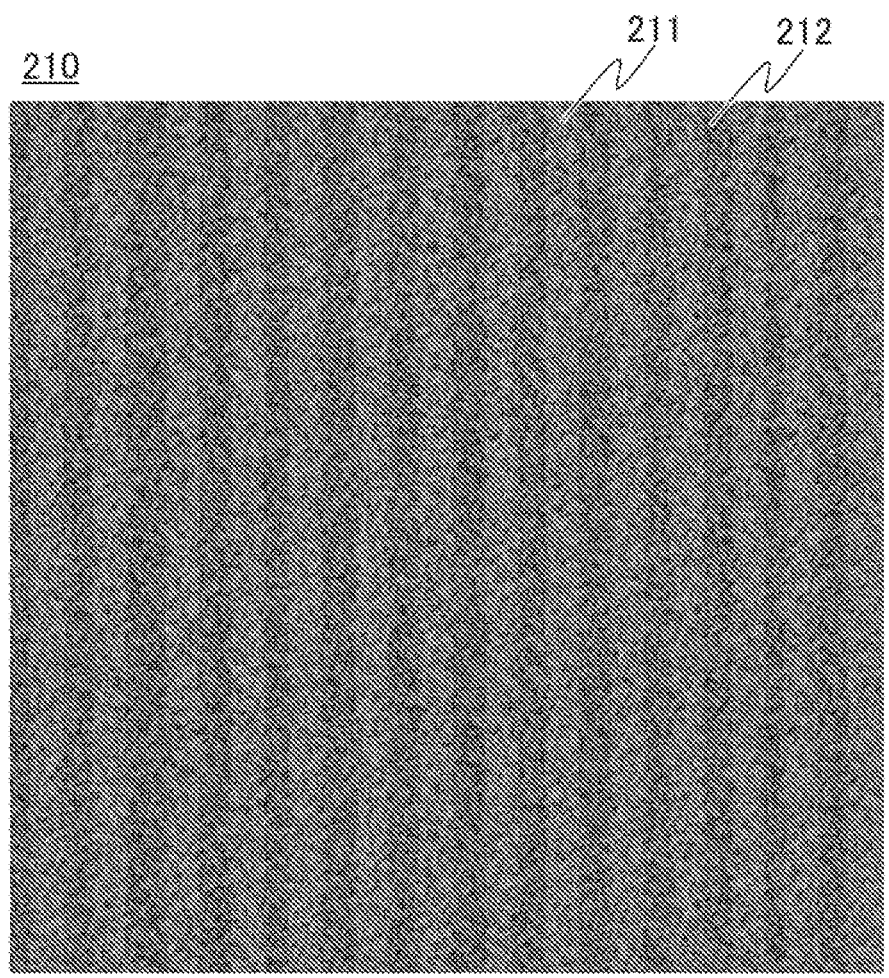
FIG. 2B is a schematic view of a lower-layer pattern image (backscattered electron image).

FIGS. 2A and 2B each illustrate an electron microscopic image (schematic view) when a sample is observed by SEM of the overlay measurement system. FIG. 2A illustrates a secondary electron image, showing a hole pattern being the upper-layer pattern. For the secondary electron image 200, since the amount of secondary electron emitted from the inside of a hole is smaller than the amount of secondary electron emitted from a resist surface, a resist top 202 is blighter than a hole bottom 201, and a hole side 203, which contains an inclined surface having the largest amount of secondary electron, is brightest. As a result, a hole position is easily specified even in case of a secondary electron image acquired at a relatively low frame.

FIG. 2B illustrates a backscattered electron image, showing a line pattern being the lower-layer pattern. The backscattered electron image 210 shows contrast between a line space 211 and a space pattern 212 due to bumps and dips formed by lines and spaces and a difference between an element constituting the line and an element constituting the space. However, influence of a layer stacked on the lower-layer pattern appears as nose in the image, and thus the line space 211 and the space pattern 212 are difficult to be distinguished from each other in the backscattered electron image 210 acquired at the same low frame as that for the secondary electron image 200. Although the line pattern is emphasized to a visible level for explanation in FIG. 2B, a difference in contrast between the line and the space is substantially not visible in an actually acquired low-frame backscattered electron image.

In this way, it is difficult to perform detection of a pattern including pattern width or a pattern edge from the backscattered electron image acquired at a low frame. As a result, even if the low-frame secondary electron image 200 is overlayed on the backscattered electron image 210, position displacement between the upper-layer pattern and the lower-layer pattern cannot be checked.

Figure 3:
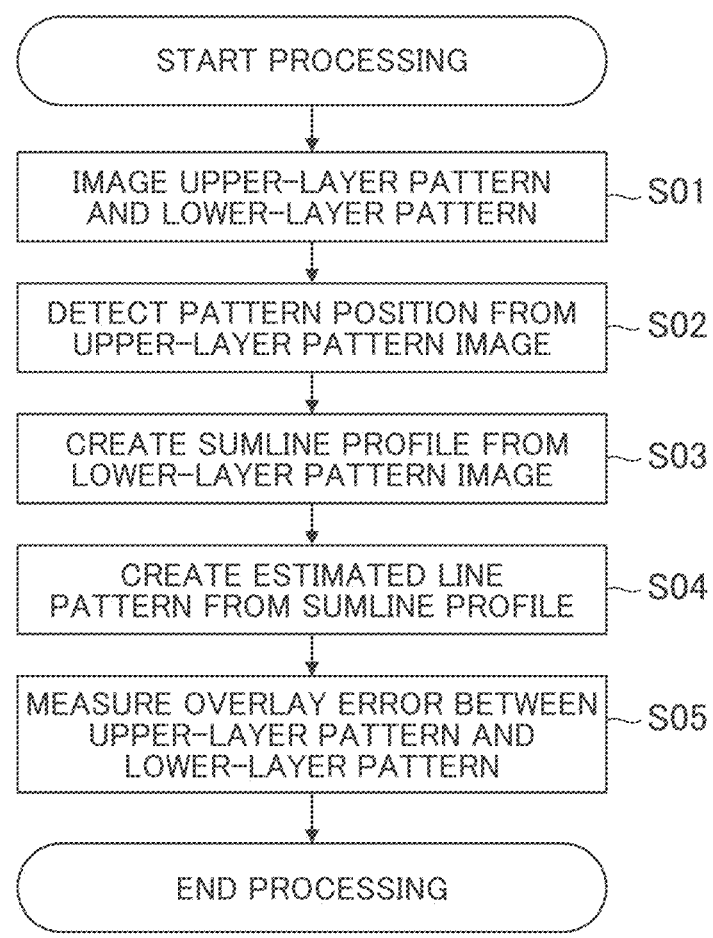
FIG. 3 is a flowchart of an overlay measurement process.

FIG. 3 illustrates a flowchart of an overlay measurement process of the first embodiment. To acquire an image of a sample (wafer), a measurement condition such as an optical condition is beforehand determined on GUI. A configuration of GUI is described later (FIG. 10). In addition, an upper-layer pattern on a sample surface and a lower-layer pattern formed under the film to be etched are beforehand adjusted to be observable on the same coordinates by the two detectors, the secondary electron detector 107 and the backscattered electron detector 109. Such adjustment may be manually performed by an operator, or automatically performed using autofocusing, for example.

The device control section 119 instructs sequence execution of overlay measurement and thus processing is started.

First, the upper-layer pattern and the lower-layer pattern are imaged (S01). For the upper-layer pattern, a secondary electron image (see FIG. 2A) is acquired by the secondary electron detector 107. For the lower-layer pattern, a backscattered electron image (see FIG. 2B) is acquired by the backscattered electron detector 109. The acquired images are recorded in the storage device 124. For imaging, a focal position of the primary electron beam is adjusted to a sample surface. Hence, blur may occur in the backscattered electron image of the lower-layer pattern depending on focal depth of SEM. However, since a relative positional relationship between the upper-layer pattern and the lower-layer pattern is observed in the overlay measurement, slight edge blur does not affect measurement accuracy.

The frame number in imaging is set to be low as described above. The frame number may be optionally determined by an operator, or may be automatically determined using the following frame number determination processing.

Figure 4:
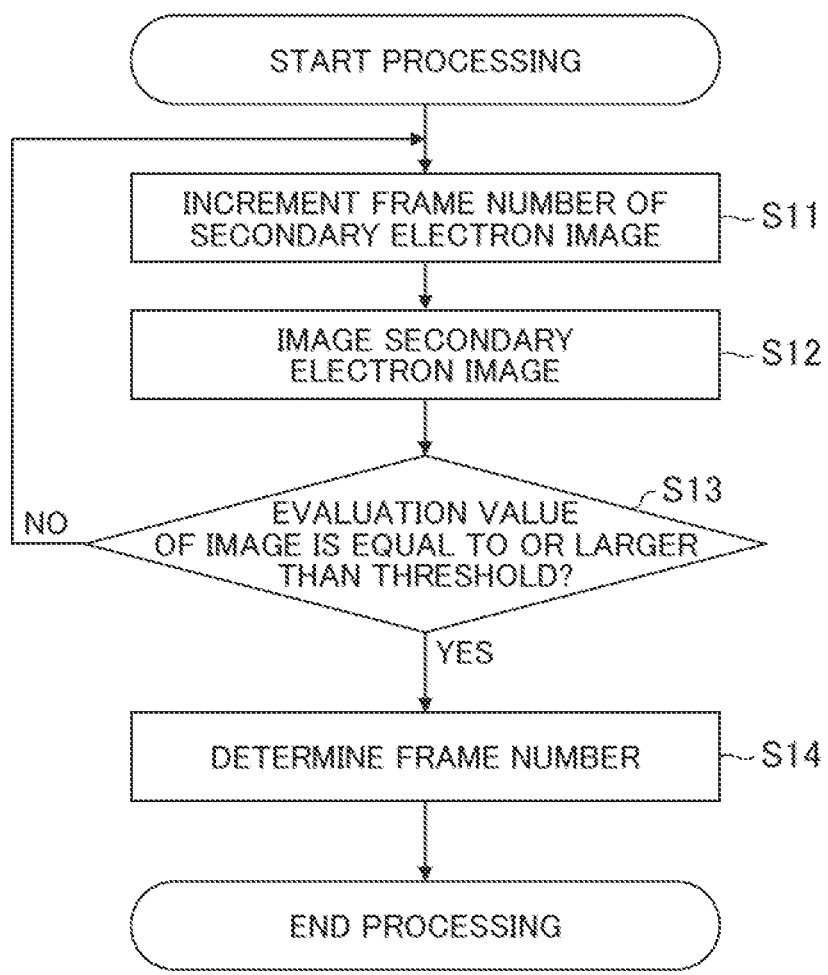
FIG. 4 illustrates a procedure of frame number determination processing based on a hole pattern.

FIG. 4 illustrates a procedure for determining a frame number based on an upper-layer pattern image. While the frame number to be summed for acquiring the secondary electron image is increased by one (S11), an evaluation value of the acquired secondary electron image is confirmed (S12, S13). For example, a luminance variance value of the acquired secondary electron image can be used as the evaluation value. Another method, which can numerically evaluate the image blur amount, may be used. A frame number, which is given when the evaluation value becomes equal to or larger than a threshold, is used as the frame number in the imaging step (S01) (S14). This procedure may be performed before the imaging step (S01), or may be performed in the imaging step (S01) while the secondary electron image used for the frame number evaluation is used for the overlay measurement. A value, which is enough to detect a hole pattern in pattern detection processing on the upper-layer pattern image as described later, is beforehand set as the threshold of the evaluation value.

Figure 5:
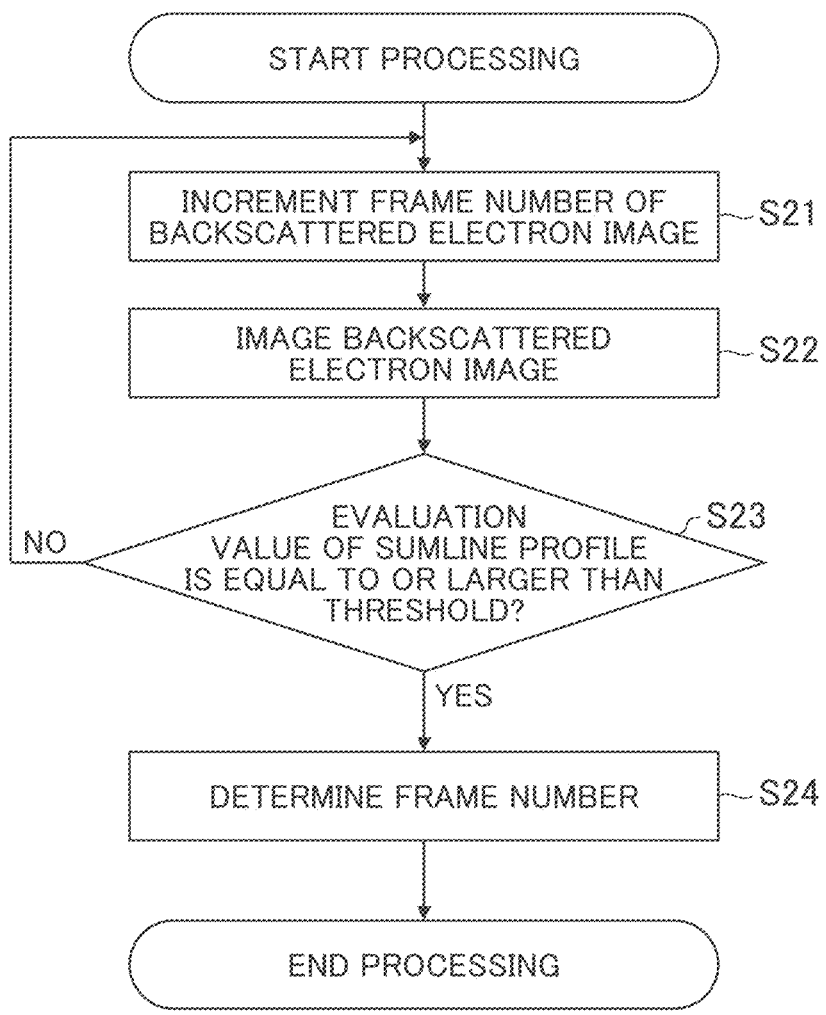
FIG. 5 illustrates a procedure of frame number determination processing based on a line pattern.

FIG. 5 illustrates a procedure for determining the frame number based on a lower-layer pattern image. While the frame number to be summed for acquiring the backscattered electron image is increased by one (S21), an evaluation value of a SUMLINE profile (as described later) obtained from the acquired backscattered electron image is confirmed (S22, S23). For example, the luminance variation amount of the SUMLINE profile can be used as the evaluation value. Another method, which can numerically evaluate the variation amount of the SUMLINE profile, may be used. A frame number, which is given when the evaluation value becomes equal to or larger than a threshold, is used as the frame number in the imaging step (S01) (S24). This procedure may be performed before the imaging step (S01), or may be performed in the imaging step (S01) while the backscattered electron image used for the frame number evaluation is used for the overlay measurement. A value, which is enough to separate a pattern during SUMLINE profile creation for the lower-layer pattern image as described later, is beforehand set as the threshold of the evaluation value.

The procedures of FIGS. 4 and 5 can be concurrently performed. In such a case, a larger one between the frame number obtained by the procedure of FIG. 4 and the frame number obtained by the procedure of FIG. 5 is used as the frame number in the imaging step (S01).

When the frame images are integrated to obtain the electron microscopic image, since image drift may occur due to sample charge, frame integration is desirably performed after drift amount is detected between frames and corrected.

When both the upper-layer pattern image and the lower-layer pattern image are acquired, different processing is performed for each image as preprocessing for the overlay measurement.

Figure 6:
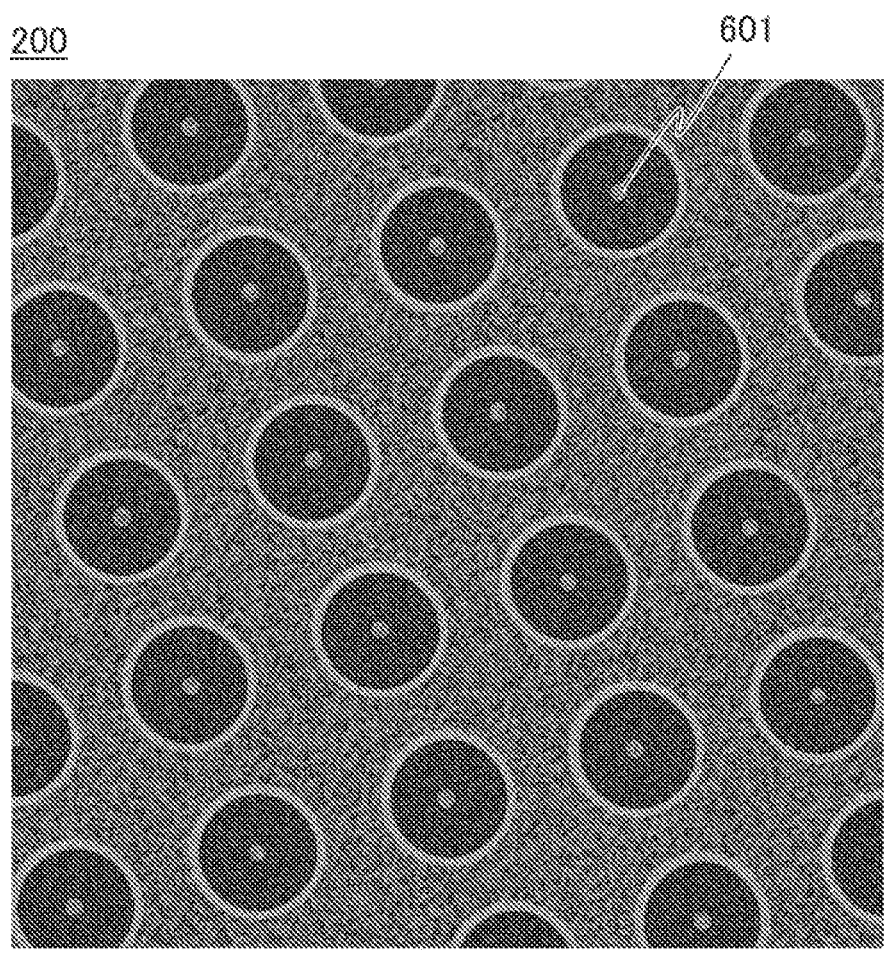
FIG. 6 illustrates an example of detecting a central position of a hole pattern from a secondary electron image.

First, the pattern position detection section 125 detects a pattern position from the upper-layer pattern image (S02). FIG. 6 illustrates an example of detecting a central position of a hole pattern from a secondary electron image (upper-layer pattern image) 200. The pattern and the central position 601 of the pattern in the secondary electron image are detected by performing pattern detection with normalized correlation on the upper-layer pattern image. A usable pattern detection algorithm may include a known algorithm such as phase restriction correlation algorithm without being limited to the normalized correlation algorithm. In addition, "central position of the pattern" may be a geometrical central position or a barycentric position, and may include any coordinate position uniquely specified from a pattern shape.

Figure 7:
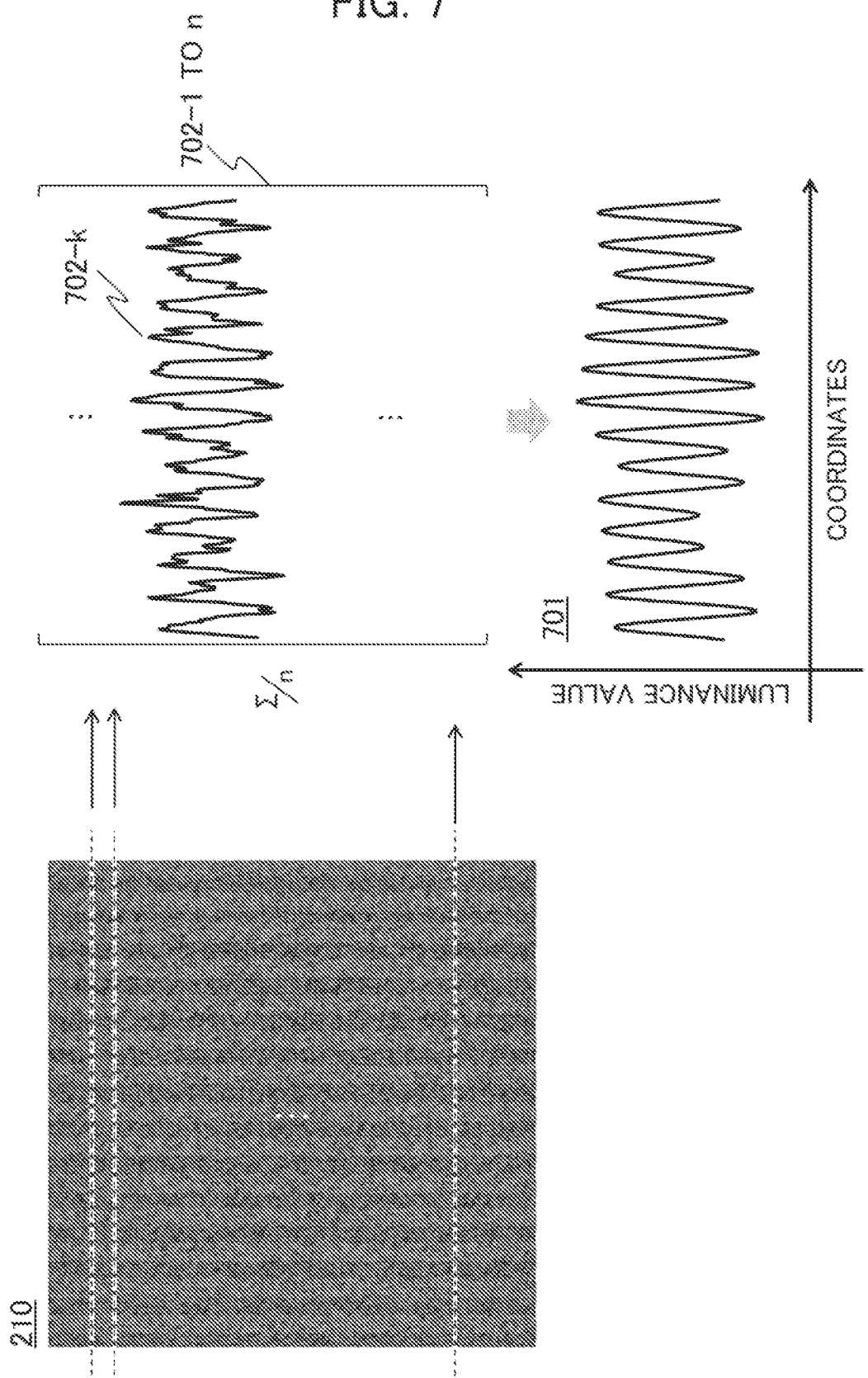
FIG. 7 is a schematic illustration of summary of image processing performed on a backscattered electron image.

On the other hand, the profile creation section 126 creates the SUMLINE profile from the lower-layer pattern image (S03). FIG. 7 is a schematic illustration of summary of image processing performed by the profile creation section 126 on the backscattered electron image (lower-layer pattern image) 210 illustrated in FIG. 2B. The lower-layer pattern image 210 has low SN as it is imaged, and thus the line pattern cannot be confirmed. Thus, luminance information is summed along a longitudinal direction of the line pattern of the backscattered electron image (SUMLINE) to calculate a SUMLINE profile 701 as average of luminance information.

In a profile 702-*k* corresponding to one line of the lower-layer pattern image shown as one example, a luminance value of the line pattern is unstable due to noise, making it difficult to specify width and an edge coordinate position of the pattern. In contrast, in the SUMLINE profile 701, random noise is reduced by sum averaging, and thus a shape of the line profile is clearly reproduced, making it possible to specify width and the edge coordinate position of the line profile.

Subsequently, the pattern estimation section 127 estimates a line pattern contained in the backscattered electron image from the SUMLINE profile (S04). An estimation method probably includes a method where a certain luminance value of the SUMLINE profile is determined as a threshold, and a point intersecting the luminance value determined as the threshold is detected as an edge of the line pattern. However, another algorithm for detecting an edge from a SUMLINE profile, such as an algorithm using a change in gradient of the SUMLINE profile 70, may be used without being limited to the above algorithm.

Figure 8:
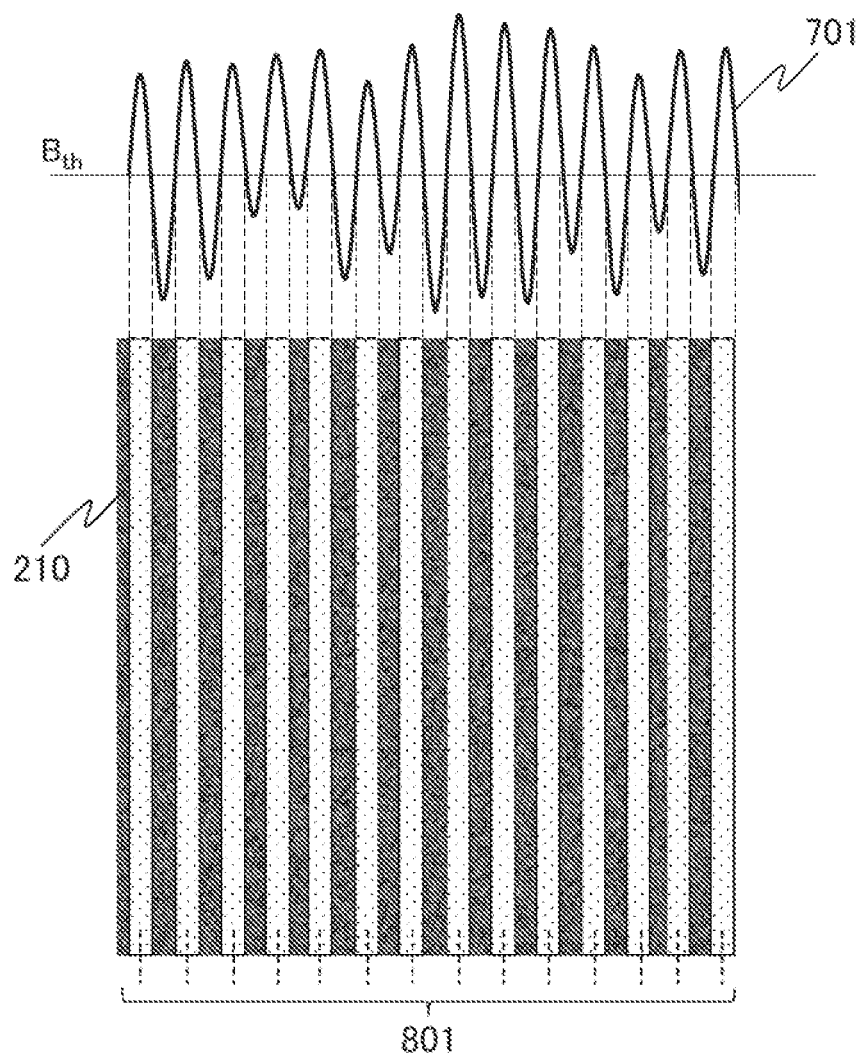
FIG. 8 is a schematic illustration of an outline of processing of estimating a line pattern from a SUMLINE profile.

FIG. 8 is a schematic illustration of an outline of processing of estimating a line pattern from the SUMLINE profile 701. In this exemplary case, edge coordinates on the SUMLINE profile are obtained with a threshold Bth, and the edge coordinates are extended by a length corresponding to the number of image lines of the backscattered electron image, thereby an estimated line pattern 801 is generated.

Subsequently, the overlay calculation section 128 compares on the same coordinates positional information of an upper-layer pattern calculated from the upper-layer pattern image to positional information of a lower-layer pattern detected using a line pattern estimated from the lower-layer pattern image, thereby measures overlay error (S05).

Figure 9:
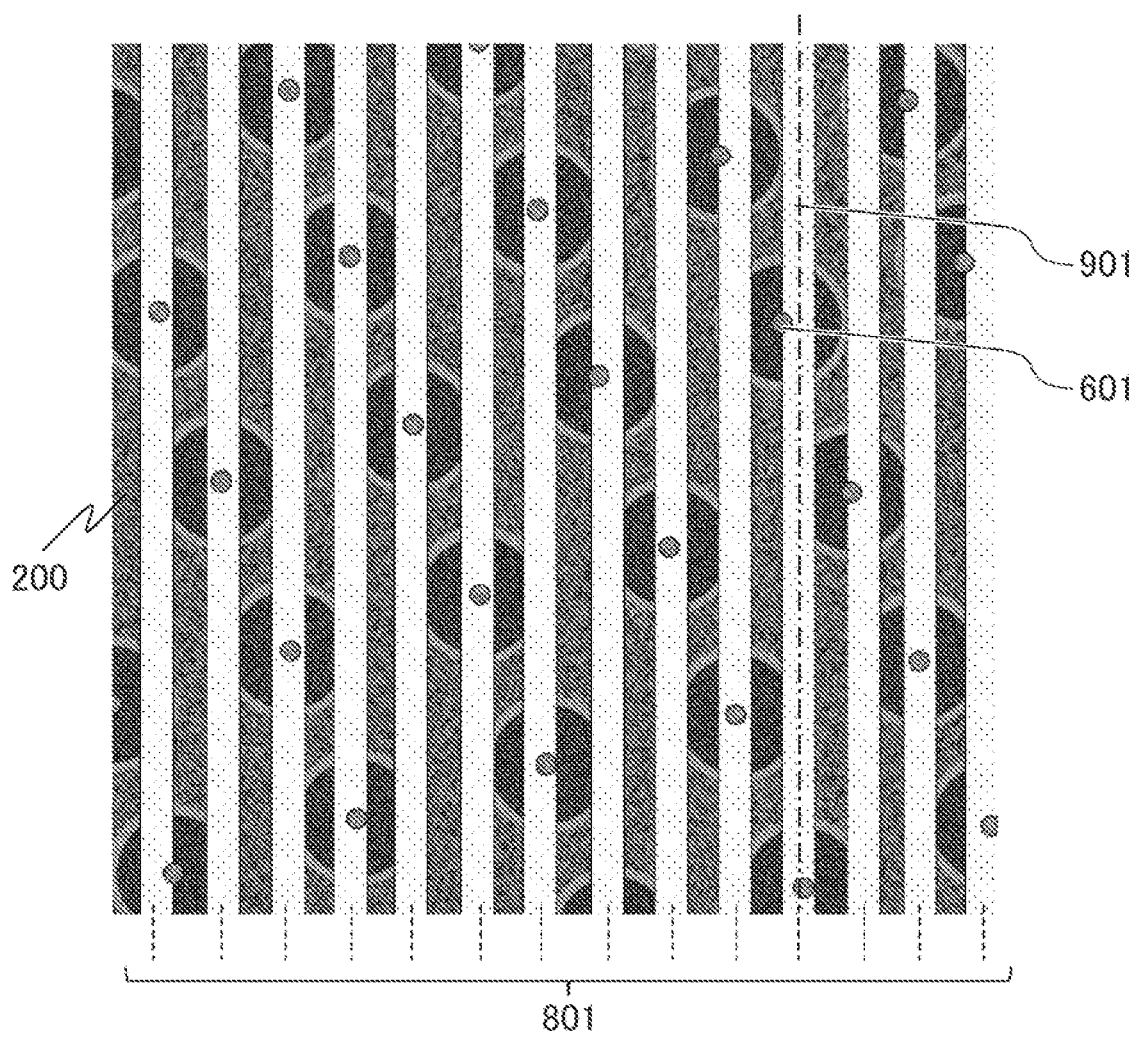
FIG. 9 illustrates overlay measurement using the central position of the hole pattern and an estimated line pattern.

FIG. 9 illustrates an aspect of overlay measurement using the hole-pattern central position 601 calculated from the upper-layer pattern image and an estimated line pattern 801 estimated from a lower-layer pattern. Overlay accuracy between the upper-layer pattern and the lower-layer pattern can be verified by measuring overlay error, such as presence or absence of the hole-pattern central position 601 inside a corresponding line pattern of the estimated line pattern 801, displacement of the central position 601 from a corresponding line pattern central-axis 901, or outward displacement of the central position 601 from edge coordinates of a corresponding line pattern. The line pattern central-axis 901 can be obtained from the edge coordinates of the estimated line pattern 801. The measured overlay error is output to, for example, the display section of the input/output unit 122.

FIG. 10 exemplifies a graphical user interface (GUI) screen 1000 displayed on the display section of the input/output unit 122. The scanning electron microscope of the overlay measurement system is controlled depending on a device condition set on the GUI screen 1000.

Imaging image size 1001, accelerating voltage 1002, probe current 1003, and a cumulative frame number 1004 are arranged as setting items on the GUI screen 1000. Although FIG. 10 shows an example where a numerical value is specified to the cumulative frame number 1004, the cumulative frame number can be automatically set by entering "AUTO".

In addition, a measurement pattern 1005, a measurement algorithm 1006, and a measurement option 1007 in the secondary electron detector 107 are arranged as setting items for the respective detectors. Likewise, a measurement pattern 1008, a measurement algorithm 1009, and a measurement option 1010 in the backscattered electron detector 109 are arranged.

Although an exemplary case where the upper-layer pattern is a hole pattern while the lower-layer pattern is a line pattern has been described in the above embodiment, the upper-layer pattern and the lower-layer pattern may each be a line pattern. While the estimation of a line pattern using the SUMLINE profile of the first embodiment is applicable to an electron microscopic image with low SN, such estimation is also applicable to both the upper-layer pattern and the lower-layer pattern and further applicable to both the secondary electron image and the backscattered electron image. In case where the upper-layer pattern and the lower-layer pattern are each a line pattern, the estimation of a line pattern using the SUMLINE profile can be performed for both the line patterns.

Hence, the measurement pattern (1005, 1008), the measurement algorithm (1006, 1009), and the measurement option (1007, 1010) can be set for each detector.

In the measurement pattern (1005, 1008), a pattern type to be detected is selected for each detector. A pattern other than the line pattern (Line & Space) and the hole pattern (Hole) may be added. The setting item in the measurement algorithm or the measurement option may be changed depending on the pattern.

In the measurement algorithm (1006, 1009), a preprocessing type to be performed for pattern detection is selected for each detector. In case of the algorism of "Sum Line", the SUMLINE processing as shown in FIG. 7 is performed before pattern detection to create an estimated pattern image as shown in FIG. 8. Pattern detection is performed using the estimated pattern image. In case of the algorithm of "Detection of pattern center", pattern detection is performed on an electron microscopic image without preprocessing. For the measurement algorithm, another processing may also be added as necessary. For example, an item, in which noise removal filtering using a typical smoothing filter is performed as preprocessing before pattern detection, may be added.

A further setting item may be necessary depending on the measurement algorithm. In such a case, the measurement option (1007, 1010) is set. For example, in case of the algorithm of "Sum Line", a sum direction is set in the measurement option, thereby an appropriate SUMLINE profile can be acquired regardless of a longitudinal direction of the line pattern.

Second Embodiment

In the first embodiment, overlay measurement can be performed on the electron microscopic image of the wafer (sample) 110 imaged by the imaging tool 120 and thus can be performed online. On the other hand, in a second embodiment, overlay measurement is performed offline on an already acquired image. In the second embodiment, an electron microscopic image imaged by the imaging tool 120 is stored in an image storage section 1110. The image storage section 1110 can be implemented by a data server. A computer system (overlay measurement device) 1101 accesses the image storage section 1110 and performs overlay measurement of a pattern on a stored image.

Figure 11:
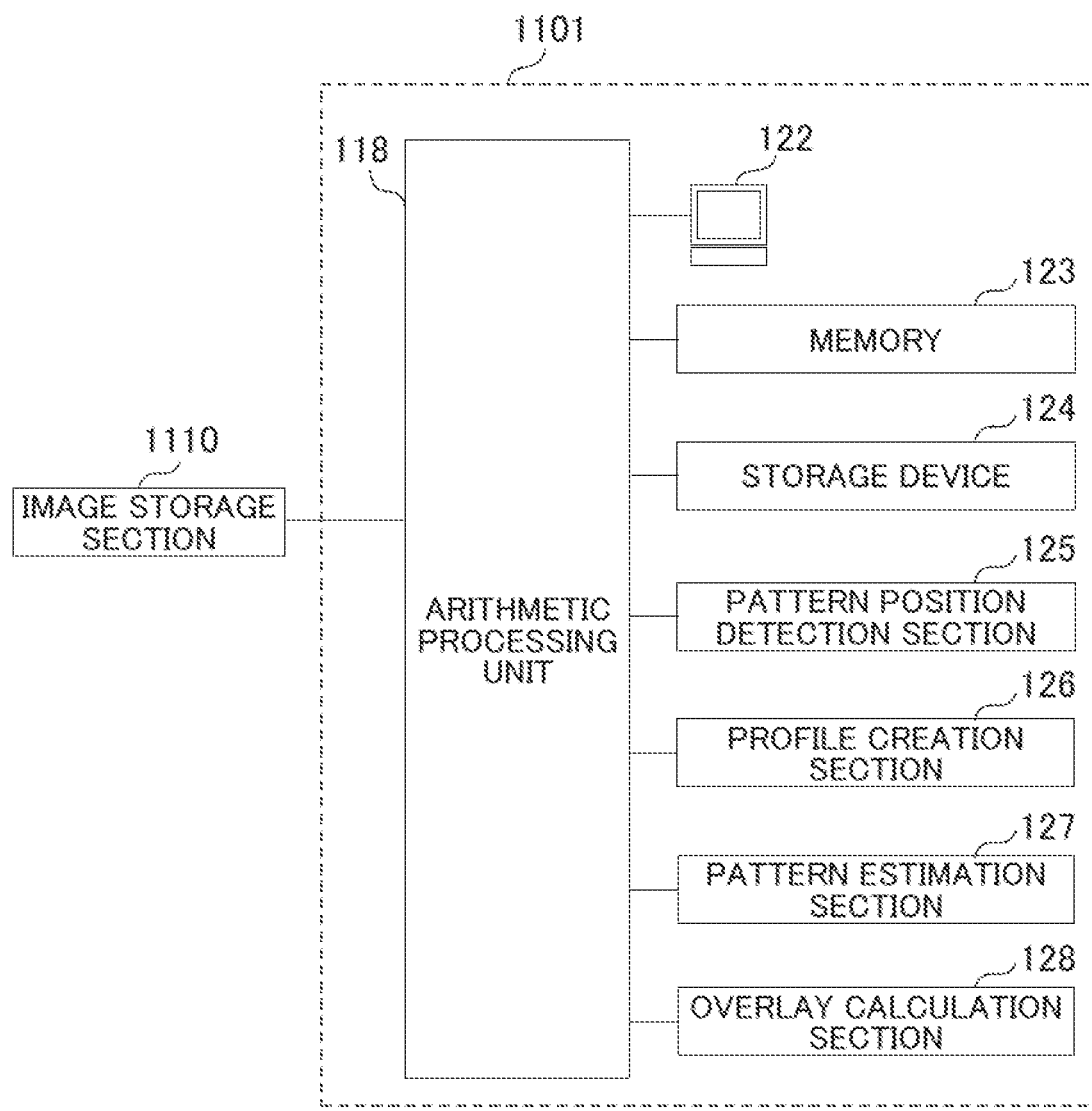
FIG. 11 illustrates a schematic configuration example of an overlay measurement system of a second embodiment.

FIG. 11 illustrates a schematic configuration of the overlay measurement device 1101. A block or a module having the same function as in the first embodiment is designated by the same reference numeral, and duplicated description is omitted. The overlay measurement device 1101 includes an arithmetic processing unit 118, an input/output unit 122, a memory 123, a storage device 124, a pattern position detection section 125, a profile creation section 126, a pattern estimation section 127, and an overlay calculation section 128.

The overlay measurement device 1101 receives an instruction of overlay measurement from the input/output unit 122, reads an image from the image storage section 1110, and performs processing of S02 and subsequent steps of FIG. 3, and thus can perform the same processing as in the first embodiment.

The above-described respective embodiments have been described to plainly explain the invention, and the invention is not necessarily limited to a system having all the described configurations. Furthermore, another configuration can be added to, eliminated from, or substituted for part of the configuration of each embodiment. Further, in the embodiments, the illustrated control lines and information lines are those considered to be necessary for explanation, and do not necessarily show all control lines and information lines provided in a product. The sample to be subjected to overlay measurement is not limited to the sample described in each embodiment.

Information such as a program, a table, and a file for enabling each function can be stored in a recording device such as a memory, a hard disc, and a solid-state drive (SSD), or a recording medium such as an IC card, an SD card, and an optical disc.

LIST OF REFERENCE SIGNS

- 100 Overlay measurement system
- 101 Column
- 102 Sample chamber
- 103 Electron gun
- 104 Condenser lens
- 105 Objective lens
- 106 Deflector
- 107 Secondary electron detector
- 108 E×B filter
- 109 Backscattered electron detector
- 110 Wafer (sample)
- 111 Electrostatic chuck
- 112 Movable stage
- 113 Standard sample
- 114 Optical microscope
- 115 Deflector control section
- 116 Stage control section
- 117 Image generation section
- 118 Arithmetic processing unit
- 119 Device control section
- 120 Imaging tool
- 121 Computer subsystem (overlay measurement device)
- 122 Input/output unit
- 123 Memory
- 124 Storage device
- 125 Pattern position detection section
- 126 Profile creation section
- 127 Pattern estimation section
- 128 Overlay calculation section
- 200 Secondary electron image
- 210 Backscattered electron image
- 701 SUMLINE profile
- 801 Estimated line pattern
- 1000 GUI screen
- 1110 Image storage section
- 1101 Computer system (overlay measurement device)

The invention claimed is:

1. An overlay measurement system that comprises a scanning electron microscope and a computer subsystem and measures overlay error of a sample having an upper-layer pattern and a lower-layer pattern including a line pattern,
   wherein the scanning electron microscope includes
   an electron optical system that applies a primary electron beam to the sample,
   a secondary electron detector that detects secondary electrons among signal electrons emitted by scanning a surface of the sample with the primary electron beam, and
   a backscattered electron detector that detects backscattered electrons among the signal electrons, and
   the computer subsystem is configured to
   form a secondary electron image from a detection signal of the secondary electron detector and form a backscattered electron image from a detection signal of the backscattered electron detector,
   create a SUMLINE profile by summing luminance information of the backscattered electron image along a longitudinal direction of the line pattern, and
   calculate overlay error of the sample using positional information of the upper-layer pattern detected from the secondary electron image and positional information of the lower-layer pattern detected using an estimated line pattern estimated based on edge coordinates on the SUMLINE profile from the backscattered electron image,
   wherein the upper-layer pattern is a pattern formed in a resist layer or an organic matter layer and the line pattern includes a metal layer or a semiconductor layer.

2. The overlay measurement system according to claim 1, wherein the computer subsystem obtains the positional information of the upper-layer pattern by performing pattern detection on the secondary electron image.

3. The overlay measurement system according to claim 1, wherein the computer subsystem determines the edge coordinates on the SUMLINE profile based on points at which the SUMLINE profile intersects a threshold luminance value or based on a change in gradient of the SUMLINE profile.

4. An overlay measurement system that comprises a scanning electron microscope and a computer subsystem and measures overlay error of a sample having an upper-layer pattern and a lower-layer pattern including a line pattern,
   wherein the scanning electron microscope includes
   an electron optical system that applies a primary electron beam to the sample,
   a secondary electron detector that detects secondary electrons among signal electrons emitted by scanning a surface of the sample with the primary electron beam, and
   a backscattered electron detector that detects backscattered electrons among the signal electrons, and
   the computer subsystem is configured to
   form a secondary electron image from a detection signal of the secondary electron detector and form a backscattered electron image from a detection signal of the backscattered electron detector,
   create a SUMLINE profile by summing luminance information of the backscattered electron image along a longitudinal direction of the line pattern, and
   calculate overlay error of the sample using positional information of the upper-layer pattern detected from the secondary electron image and positional information of the lower-layer pattern detected using an estimated line pattern estimated based on edge coordinates on the SUMLINE profile from the backscattered electron image,
   wherein the computer subsystem is configured to display a setting screen to set a measurement pattern, a measurement algorithm, and a measurement option for each of the detectors of the secondary electron detector and the backscattered electron detector,
   wherein a pattern detected from an image is set as the measurement pattern, an algorithm to detect the pattern set as the measurement pattern from the image is set as the measurement algorithm, and a setting item necessary for detecting the pattern set as the measurement pattern from the image according to the algorithm set as the measurement algorithm is set as the measurement option.

5. The overlay measurement system according to claim 4, wherein the computer subsystem is configured to display a setting screen to set a condition for acquiring the secondary electron image and the backscattered electron image, wherein the condition includes a cumulative frame number to acquire the secondary electron image and the backscattered electron image.

6. The overlay measurement system according to claim 5, wherein the cumulative frame number is automatically set with the setting screen.

7. An overlay measurement system that comprises a scanning electron microscope and a computer subsystem and measures overlay error of a sample having an upper-layer pattern and a lower-layer pattern including a line pattern, wherein the scanning electron microscope includes an electron optical system that applies a primary electron beam to the sample, a secondary electron detector that detects secondary electrons among signal electrons emitted by scanning a surface of the sample with the primary electron beam, and a backscattered electron detector that detects backscattered electrons among the signal electrons, and the computer subsystem is configured to form a secondary electron image from a detection signal of the secondary electron detector and form a backscattered electron image from a detection signal of the backscattered electron detector, create a SUMLINE profile by summing luminance information of the backscattered electron image along a longitudinal direction of the line pattern, and calculate overlay error of the sample using positional information of the upper-layer pattern detected from the secondary electron image and positional information of the lower-layer pattern detected using an estimated line pattern estimated based on edge coordinates on the SUMLINE profile from the backscattered electron image, wherein the computer subsystem sets a cumulative frame number to acquire the secondary electron image and the backscattered electron image, and creates the SUMLINE profile while increasing by one a frame number to be summed for acquiring the backscattered electron image, and sets a frame number, the frame number being given when an evaluation value of the SUMLINE profile becomes equal to or larger than a threshold, as the cumulative frame number.

8. The overlay measurement system according to claim 7, wherein the evaluation value of the SUMLINE profile is defined as the luminance variation amount of the SUMLINE profile.

9. The overlay measurement system according to claim 7, wherein the computer subsystem creates the secondary electron image while increasing by one frame number to be summed for acquiring the secondary electron image, compares a frame number given when the evaluation value of the secondary electron image becomes equal to or larger than a threshold to the frame number given when the evaluation value of the SUMLINE profile becomes equal to or larger than a threshold, and sets a larger frame number as the cumulative frame number.

10. An overlay measurement system that comprises a scanning electron microscope and a computer subsystem and measures overlay error of a sample having an upper-layer pattern and a lower-layer pattern including a line pattern, wherein the scanning electron microscope includes an electron optical system that applies a primary electron beam to the sample, a secondary electron detector that detects secondary electrons among signal electrons emitted by scanning a surface of the sample with the primary electron beam, and a backscattered electron detector that detects backscattered electrons among the signal electrons, and the computer subsystem is configured to form a secondary electron image from a detection signal of the secondary electron detector and form a backscattered electron image from a detection signal of the backscattered electron detector, create a SUMLINE profile by summing luminance information of the backscattered electron image along a longitudinal direction of the line pattern, and calculate overlay error of the sample using positional information of the upper-layer pattern detected from the secondary electron image and positional information of the lower-layer pattern detected using an estimated line pattern estimated based on edge coordinates on the SUMLINE profile from the backscattered electron image, wherein the computer subsystem sets a cumulative frame number to acquire the secondary electron image and the backscattered electron image, creates the secondary electron image while increasing by one a frame number to be summed for acquiring the secondary electron image, and sets a frame number, the frame number being given when an evaluation value of the secondary electron image becomes equal to or larger than a threshold, as the cumulative frame number.

11. The overlay measurement system according to claim 9, wherein the evaluation value of the secondary electron image is defined as a luminance variance value of the secondary electron image.

12. An overlay measurement device that measures overlay error of a sample having an upper-layer pattern and a lower-layer pattern including a line pattern from a secondary electron image and a backscattered electron image, each image being acquired by a scanning electron microscope, of the sample, the device comprising:

a profile creation section that creates a SUMLINE profile by summing luminance information of the backscattered electron image along a longitudinal direction of the line pattern; and an overlay calculation section that calculates overlay error of the sample using positional information of the upper-layer pattern detected from the secondary electron image and positional information of the lower-layer pattern detected using an estimated line pattern estimated based on edge coordinates on the SUMLINE profile from the backscattered electron image, wherein the secondary electron image is an electron microscopic image formed based on secondary electrons contained in signal electrons emitted by scanning a surface of the sample with a primary electron beam, and the backscattered electron image is an electron microscopic image formed based on backscattered electrons contained in the signal electrons, wherein the upper-layer pattern is a pattern formed in a resist layer or an organic matter layer and the line pattern includes a metal layer or a semiconductor layer.

13. The overlay measurement device according to claim 12, wherein the secondary electron image and the backscattered electron image are each the electron microscopic image formed by integrating a predetermined number of frame images obtained by scanning the surface of the sample with the primary electron beam.

14. The overlay measurement device according to claim 12, wherein the secondary electron image and the backscattered electron image are stored in an image storage section, and the image storage section is accessed to acquire the secondary electron image and the backscattered electron image.

15. The overlay measurement device according to claim 12, further comprising:

an arithmetic processing unit; and a storage device, wherein the storage device stores a program that allows the arithmetic processing unit to execute processing of the profile creation section and a program that allows the arithmetic processing unit to execute processing of the overlay calculation section.

16. The overlay measurement system according to claim 10, wherein the evaluation value of the secondary electron image is defined as a luminance variance value of the secondary electron image.

17. The overlay measurement system according to claim 1, wherein the pattern formed in the resist layer or the organic matter layer is a hole pattern, the computer subsystem is configured to detect a central position information of the hole pattern by performing pattern detection with normalized correction on the secondary electron image, and calculate overlay error of the sample using the central position information and the positional information of the lower-layer pattern.

18. The overlay measurement system according to claim 1, wherein the line pattern of the lower-layer pattern is formed under a film to be etched directly under the upper-layer pattern.

19. The overlay measurement system according to claim 1, wherein the upper-layer pattern is a second line pattern, the computer subsystem is configured to create a second SUMLINE profile by summing luminance information of the secondary electron image along a longitudinal direction of the second line pattern, and calculate overlay error of the sample using positional information of the upper-layer pattern detected based on the second SUMLINE profile and positional information of the lower-layer pattern.

20. The overlay measurement system according to claim 1, wherein the computer subsystem has a user interface to set a measurement of overlay error of the sample and create the SUMLINE profile following the setting the measurement of overlay error from the user interface.

21. The overlay measurement system according to claim 4, wherein the computer subsystem has a user interface to set a measurement of overlay error of the sample and create the SUMLINE profile following the setting the measurement of overlay error from the user interface.

22. The overlay measurement system according to claim 7, wherein the computer subsystem has a user interface to set a measurement of overlay error of the sample and create the SUMLINE profile following the setting the measurement of overlay error from the user interface.

23. The overlay measurement system according to claim 10, wherein the computer subsystem has a user interface to set a measurement of overlay error of the sample and create the SUMLINE profile following the setting the measurement of overlay error from the user interface.

24. The overlay measurement device according to claim 12, further comprising:

a user interface to set a measurement of overlay error of the sample, wherein the profile creation section creates the SUMLINE profile following the setting the measurement of overlay error from the user interface.

25. The overlay measurement system according to claim 1, wherein the estimated line pattern is generated by extending the edge coordinates by a length corresponding to a number of image lines of the backscattered electron image.

26. The overlay measurement system according to claim 4, wherein the estimated line pattern is generated by extending the edge coordinates by a length corresponding to a number of image lines of the backscattered electron image.

27. The overlay measurement system according to claim 7, wherein the estimated line pattern is generated by extending the edge coordinates by a length corresponding to a number of image lines of the backscattered electron image.

28. The overlay measurement system according to claim 10, wherein the estimated line pattern is generated by extending the edge coordinates by a length corresponding to a number of image lines of the backscattered electron image.

29. The overlay measurement device according to claim 12, wherein the estimated line pattern is generated by extending the edge coordinates by a length corresponding to a number of image lines of the backscattered electron image.

30. The overlay measurement system according to claim 1, wherein the overlay error shows presence or absence of positional information of the upper-layer pattern inside positional information of a corresponding line pattern of the estimated line pattern, displacement of positional information of the upper-layer pattern from positional information of a corresponding line pattern central-axis of the estimated line pattern, or outward displacement of positional information of the upper-layer pattern from positional information of edge of a corresponding line pattern of the estimated line pattern.

31. The overlay measurement system according to claim 4,
wherein the overlay error shows presence or absence of positional information of the upper-layer pattern inside positional information of a corresponding line pattern of the estimated line pattern, displacement of positional information of the upper-layer pattern from positional information of a corresponding line pattern central-axis of the estimated line pattern, or outward displacement of positional information of the upper-layer pattern from positional information of edge of a corresponding line pattern of the estimated line pattern.

32. The overlay measurement system according to claim 7,
wherein the overlay error shows presence or absence of positional information of the upper-layer pattern inside positional information of a corresponding line pattern of the estimated line pattern, displacement of positional information of the upper-layer pattern from positional information of a corresponding line pattern central-axis of the estimated line pattern, or outward displacement of positional information of the upper-layer pattern from positional information of edge of a corresponding line pattern of the estimated line pattern.

33. The overlay measurement system according to claim 10,
wherein the overlay error shows presence or absence of positional information of the upper-layer pattern inside positional information of a corresponding line pattern of the estimated line pattern, displacement of positional information of the upper-layer pattern from positional information of a corresponding line pattern central-axis of the estimated line pattern, or outward displacement of positional information of the upper-layer pattern from positional information of edge of a corresponding line pattern of the estimated line pattern.

34. The overlay measurement device according to claim 12,
wherein the overlay error shows presence or absence of positional information of the upper-layer pattern inside positional information of a corresponding line pattern of the estimated line pattern, displacement of positional information of the upper-layer pattern from positional information of a corresponding line pattern central-axis of the estimated line pattern, or outward displacement of positional information of the upper-layer pattern from positional information of edge of a corresponding line pattern of the estimated line pattern.

* * * * *